United States Patent
Nemirow et al.

(10) Patent No.: US 10,209,301 B2
(45) Date of Patent: Feb. 19, 2019

(54) WAVEFORM MAPPING AND GATED LASER VOLTAGE IMAGING

(71) Applicant: FEI Company, Hillsboro, OR (US)

(72) Inventors: Christopher Nemirow, San Jose, CA (US); Neel Leslie, San Jose, CA (US)

(73) Assignee: FEI Company, Hillsboro, OR (US)

( * ) Notice: Subject to any disclaimer, the term of this patent is extended or adjusted under 35 U.S.C. 154(b) by 102 days.

(21) Appl. No.: 15/344,366

(22) Filed: Nov. 4, 2016

(65) Prior Publication Data

US 2017/0131349 A1    May 11, 2017

Related U.S. Application Data

(60) Provisional application No. 62/252,345, filed on Nov. 6, 2015.

(51) Int. Cl.
  G01R 31/308 (2006.01)
  G01R 31/311 (2006.01)
  (Continued)

(52) U.S. Cl.
  CPC ............ G01R 31/311 (2013.01); G01R 31/01 (2013.01); G02B 21/002 (2013.01); *G01R 31/31705* (2013.01)

(58) Field of Classification Search
  CPC .............. G02B 21/002; G02B 21/0064; G02B 21/0032; G02B 21/0048; G02B 21/0004;
  (Continued)

(56) References Cited

U.S. PATENT DOCUMENTS 5,430,305 A * 7/1995 Cole, Jr. .............. G01R 31/311
                                                250/559.07
5,905,577 A    5/1999 Wilsher
                (Continued)

FOREIGN PATENT DOCUMENTS

| CN | 104661704 | 5/2015 |
| EP | 0806678 A2 | 12/1997 |
| TW | 201447335 | 12/2014 |
| WO | 2008043469 A1 | 4/2008 |

OTHER PUBLICATIONS

International Search Report and Written Opinion from International Application No. PCT/US2016/060689, dated Feb. 3, 2017, 9 pages.
(Continued)

*Primary Examiner* — Vinh Nguyen
(74) *Attorney, Agent, or Firm* — Klarquist Sparkman, LLP

(57) ABSTRACT

Systems, methods, and computer readable media to improve integrated circuit (IC) debug operations are described. In general, techniques are disclosed for acquiring/recording waveforms across an under-test IC during a single sweep of a laser scanning microscope (LSM). More particularly, techniques disclosed herein permit the acquisition of an integrated circuit's response to a test signal at each location across the IC in real-time. In practice the test signal consists of a stimulus portion that repeats after a given period. In one embodiment, the IC's response to multiple complete stimulus portions may be averaged and digitized. In another embodiment, the IC's response to multiple partial stimulus portions may be averaged and digitized. As used herein, the former approach is referred to as waveform mapping, the latter as gated-LVI.

23 Claims, 8 Drawing Sheets

(51) Int. Cl.
*G01R 31/01* (2006.01)
*G02B 21/00* (2006.01)
*G01R 31/317* (2006.01)

(58) Field of Classification Search
CPC .............. G02B 21/0016; G02B 21/006; G02B 21/0072; G02B 21/0084; G02B 21/367; G02B 21/0036; G02B 21/0068; G02B 21/248; G02B 23/2469; G02B 23/26; G02B 26/101; G02B 3/14; G02B 6/06; G02B 2207/114; G02B 23/243; G01R 31/311; G01R 31/01; G01R 31/2834; G01R 31/2882; G06T 2207/10056; G06T 2207/10061; G06T 7/0014; H01L 21/02686; H01L 21/268; H01L 21/67253; H01L 22/12; H04N 2005/2255; H04N 5/2254; H04N 5/23238; G06F 19/02; G06F 19/22

See application file for complete search history.

(56) References Cited

U.S. PATENT DOCUMENTS

| | | | |
|---|---|---|---|
| 6,617,862 B1 * | 9/2003 | Bruce | G01R 31/311 324/754.23 |
| 2006/0000984 A1 | 1/2006 | Wolleschensky | |
| 2010/0117667 A1 | 5/2010 | Lo | |
| 2014/0285227 A1 | 9/2014 | Serrels et al. | |
| 2014/0292363 A1 | 10/2014 | Ng et al. | |
| 2014/0331098 A1 | 11/2014 | Martin et al. | |
| 2015/0177149 A1 | 6/2015 | Yang et al. | |
| 2015/0241681 A1 | 8/2015 | Hara et al. | |

OTHER PUBLICATIONS

Office Action from Taiwan Application No. 105136160, dated Nov. 27, 2017, 12 pages (with English translation).

* cited by examiner

WAVEFORM MAPPING AND GATED LASER VOLTAGE IMAGING

PRIORITY CLAIM

This application claims priority to the benefit of U.S. Provisional Application No. 62/252,345, entitled "System and Method for Waveform Mapping and System and Method for Gated Laser Voltage Imaging (Gated-LVI)," filed Nov. 6, 2015, which is hereby incorporated by reference.

BACKGROUND

This disclosure relates generally to the field of semiconductor diagnostics. More particularly, but not by way of limitation, this disclosure relates to devices, systems and methods for probing integrated circuits using laser illumination.

When an incident laser is focused onto an integrated circuit (IC), the device under test (DUT), free-carriers within the device absorb and refract photons supplied by the laser. As a result, the amplitude modulation of the reflected laser light corresponds to the DUT's response to an applied electrical test pattern. Analysis of the reflected laser light reveals direct information about the active DUT. Two traditional techniques, laser voltage imaging (LVI) and laser voltage probing (LVP), are used during IC debugging operations.

LVI relies on a spectrum analyzer, a lock-in amplifier or a similar device to map a specified frequency onto a laser scanning microscope (LSM) image of the DUT. As the laser is raster-scanned over the active DUT, the amplitude of the reflected light is modulated and corresponds to the DUT signal (captured by, for example, a photodetector). The DUT signal is supplied to a spectrum analyzer or similar device which is set to the exact frequency of interest (zero-span mode). The output voltage of the spectrum analyzer is directly proportional to the strength of the signal at the specified frequency. In other words, when the specific frequency component of the signal is small or nonexistent, the spectrum analyzer's output voltage level falls into the noise floor of the DUT signal. When the frequency component is large, the spectrum analyzer's voltage response increases. A frame-grabber receives the spectrum analyzer output signal. On a separate channel, the frame-grabber simultaneously creates the LSM image. Each time the LSM steps, a spectrum analyzer measurement is made. The resulting LVI map perfectly overlays the LSM image. In other words, the spectrum analyzer output generates a map of the scanned area that displays gray-scale levels corresponding to the device activity—at a given frequency—at each point of the LSM field of view. Several spectrum analyzers placed in parallel allow multiple frequencies (one frequency per spectrum analyzer) to be monitored simultaneously. Further alterations to the system—for example, replacing the spectrum analyzer with a lock-in amplifier—yield logic-state maps (phase maps) in addition to the frequency maps discussed above.

LVP, in contrast, yields waveforms from a specific location within the LSM field of view. That is, waveform collection takes place after the LSM image is acquired and the scanning has stopped. Specifically, individual DUT sites within the LSM field of view are manually probed by parking the laser on the area of interest. In operation, the reflected laser light is converted into an AC signal (e.g., by a photodetector), amplified and sent to an oscilloscope (the oscilloscope's trigger or sync signal must be synchronous with the test pattern applied to the DUT). The resulting waveform contains both timing and frequency information from the DUT at the probe location. During a typical debug procedure, large numbers of waveforms are recorded. Such probing is a deliberate and time-consuming operation. Because of this, only suspect locations on the DUT are typically examined.

Both LVI and LVP techniques suffer from limitations. Sufficient detection of the DUT's output signal (i.e., the reflected laser light) for LVI depends on the nature of the signal itself. In general, the duty-cycle and periodicity of a signal determines the spectral response of that signal. As the signal becomes less ideal—i.e., deviates from 50% duty-cycle—the number of spectral components increase which makes the response at the fundamental frequency (or any component of interest) less prominent. Consequently, the LVI signal decreases. Because LVI necessitates a robust signal, only periodic signals with sufficient duty-cycle are detectable. Imaging pulsed signals, or pulse-trains, can be exceedingly difficult or impossible. In the case of LVP, because waveforms are recorded with an oscilloscope, any repetitive signal with minimal jitter suffices. As a point measurement technique however, LVP requires deliberate waveform collection at individual probe sites (waveform collection requires that the applied laser is stationary at the measurement site; not scanning). While powerful, at the cost of minutes per waveform—including optimizing the signal and probe location—LVP is inefficient.

SUMMARY

In one embodiment the disclosed concepts provide a system to generate or produce waveform mapping and gated laser voltage imaging images. The system includes a holder to hold a circuit; a test-loop generator to supply a test-loop signal to the circuit, where the test-loop signal includes a stimulus signal that repeats every test-loop period; a laser source; first optics to direct a laser beam from the laser source onto the circuit; second optics to collect reflected laser light from the circuit; a sensor to detect the reflected laser light and to generate a sensor output in response thereto; and a high-speed digital signal averager to generate a digital output signal based on the sensor output and a synchronization signal. In one or more embodiments, the first optics comprises a laser scanning microscope (LSM) configured to raster scan the laser beam across an area of the circuit. In some embodiments, the sensor output comprises a DC component (representing a LSM image) and an AC component (representing the circuit's response to the test-loop signal). In some embodiments, the high-speed digital signal averager generates a digital output signal for each location (pixel) of the raster scan. In one embodiment, the digital output signal may be based, at each location, on the AC component resulting from the stimulus signal over multiple complete test-loop periods ("waveform mapping"). In some embodiments, the high-speed digital signal averager may be further configured to take as input a gate signal, wherein the gate signal defines at least one gate period that is less than the test-loop period. In one or more of these embodiments, the digital output signal may be based, at each location (pixel), on the AC component resulting from the stimulus signal during the gate period over multiple test-loop periods (gated-LVI). Both the LSM image and digital output signal may be stored to storage (e.g., a non-volatile magnetic or solid-state memory) so that each digital output signal may be correlated with the pixels in the LSM.

In another embodiment, a diagnostic measurement method in accordance with this disclosure includes stimulating a device under test with a test pattern, the test pattern comprising a stimulus signal that repeats after every test-loop period; illuminating an area of the device under test with a laser beam in a raster scan matter; detecting light reflecting off the device under test in response to the illuminating; identifying a direct-current (DC) component and an alternating-current (AC) component of the detected reflected light; averaging the AC component over multiple test-loop periods based on a trigger signal and a gate signal, wherein the trigger signal synchronizes the AC component to the test pattern and the gate signal selects which portion of the AC component, during each test-loop period, to digitize; digitizing the averaged AC component to generate an output signal; and storing the output signal in a memory. When the gate signal selects a portion of the AC component corresponding to a time that is less than the test-loop period, the disclosed operation may be referred to as gated-LVI. When the gate signal selects the AC component corresponding to a time that is equal to the test-loop period, the disclosed operation may be referred to as waveform mapping.

DETAILED DESCRIPTION

Figure 1:
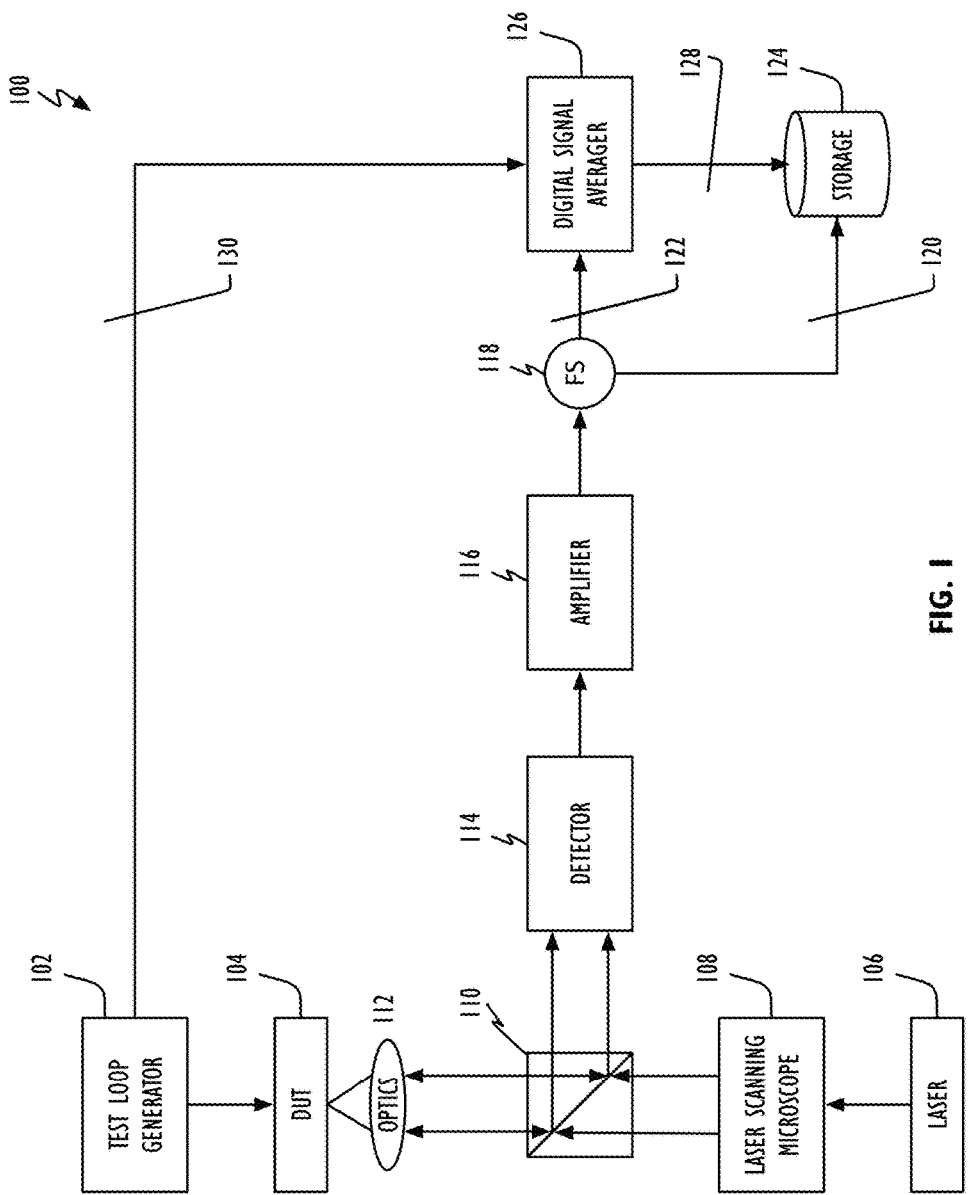
FIG. 1 shows, in block diagram form, a diagnostic system in accordance with one or more embodiments.

This disclosure pertains to systems, methods, and computer readable media to improve integrated circuit (IC) debug operations. In general, techniques are disclosed for acquiring/recording waveforms across an under-test integrated circuit during a single sweep of a laser scanning microscope (LSM). More particularly, techniques disclosed herein permit the acquisition of an integrated circuit's response to a test signal at each location across a circuit in real-time. Techniques disclosed herein can eliminate the need for most manual probing, which hastens the debug process. Moreover, because the acquired waveforms may be automatically correlated with a specific pixel in the LSM image, a data map can be created and overlaid onto the LSM image. This map can subsequently highlight the presence or absence of any specified frequency (using, for example, a Fourier transform analysis), the presence or absence of a specific pulse within a test signal (pass/fail data), and/or discrepancies from a reference signal (waveform auto-correlation). In some embodiments, a circuit's response to an entire test signal may be recorded. In other embodiments gating signals may be used to focus the detection of the circuit's response to relatively short time periods of the test signal (and to the exclusion signals received during other time periods).

In the following description, for purposes of explanation, numerous specific details are set forth in order to provide a thorough understanding of the disclosed concepts. As part of this description, some of this disclosure's drawings represent structures and devices in block diagram form in order to avoid obscuring the novel aspects of the disclosed concepts. In the interest of clarity, not all features of an actual implementation may be described. Further, as part of this description, some of this disclosure's drawings may be provided in the form of flowcharts. The boxes in any particular flowchart may be presented in a particular order. It should be understood however that the particular sequence of any given flowchart is used only to exemplify one embodiment. In other embodiments, any of the various elements depicted in the flowchart may be deleted, or the illustrated sequence of operations may be performed in a different order, or even concurrently. In addition, other embodiments may include additional steps not depicted as part of the flowchart. Moreover, the language used in this disclosure has been principally selected for readability and instructional purposes, and may not have been selected to delineate or circumscribe the inventive subject matter, resort to the claims being necessary to determine such inventive subject matter. Reference in this disclosure to "one embodiment" or to "an embodiment" means that a particular feature, structure, or characteristic described in connection with the embodiment is included in at least one embodiment of the disclosed subject matter, and multiple references to "one embodiment" or "an embodiment" should not be understood as necessarily all referring to the same embodiment.

It will be appreciated that in the development of any actual implementation (as in any software and/or hardware development project), numerous decisions must be made to achieve a developers' specific goals (e.g., compliance with system- and business-related constraints), and that these goals may vary from one implementation to another. It will also be appreciated that such development efforts might be complex and time-consuming, but would nevertheless be a routine undertaking for those of ordinary skill in the design and implementation of integrated circuit test and debug systems having the benefit of this disclosure.

Referring to FIG. 1, in one or more embodiments diagnostic system 100 may include test-loop generator 102 that electrically stimulates the device under test (DUT) 104. Laser 106 delivers a continuous-wave laser beam to laser scanning microscope (LSM) 108. Element 110 passes light from laser 106 to DUT 104 via optics 112 and, at the same time, passes light reflected from DUT 104 to detector 114. In one embodiment, detector 114 may be an avalanche photo diode. The signal from detector 114 corresponds directly to the reflected laser beam's photon flux. Amplifier 116 (e.g., a transimpedance amplifier or TIA) amplifies the signal output from detector 114 and sends its own output to frequency separator 118 (e.g., a bias-tee frequency separator circuit). Output from frequency separator 118 includes DC component or signal 120 and AC component or signal 122. DC signal 120 is a voltage indicative of the reflectivity of the circuit components being scanned and corresponds to a conventional LSM image. As shown, DC signal 120 may be stored in memory 124 (e.g., non-transitory magnetic or solid-state memory or volatile frame-grabber memory). AC component or signal 122 is indicative of the DUT's response to the electrical stimulus applied from test-loop generator 102 and may, in the illustrated embodiment, be applied to high-speed digital signal averager 126. Digitized DUT output signal 128 may also be written to memory 124. In one embodiment, trigger signal 130 may be used to synchronize the waveforms generated by high-speed digital signal averager 126 (e.g., digitized DUT output 128) with the stimulus signal provided by test-loop generator 102 and each pixel in the LSM image (represented by DC signal 120). In another embodiment, digital signal averager 126 may be synchronized by a signal directly from DUT 104 (not shown). In yet another embodiment, LSM 108 may provide a pixel clock to the high-speed digital signal averager for synchronization purposes. A LSM-to-averager connection allows direct correlation between a captured waveform and a LSM pixel. One of ordinary skill in the art will recognize element 110 as a beam-splitter. One of ordinary skill in the art will also understand that LSM 108 may include electrical and optical elements that permit a beam from laser 106 to be scanned across, or parked at a specific location on, DUT 104. It will further be recognized that optics 112 need not be limited to a single element, but may incorporate any number of components such as, for example, an objective lens, a wave plate, a tube lens and a mirror.

In operation, high-speed digital signal averager 126 digitizes DUT signal 122 and trigger signal 130 concurrently. Digital signal averager 126 can track trigger signal 130 with, for example, a phase-locked loop and can use this signal as a reference for correlation averaging of DUT signal 122. In other words, continuously streaming DUT signal 122 can be averaged in real-time by correlating the samples with the reference (trigger) signal 130. Thus, unlike prior art approaches, the techniques disclosed herein enable a waveform to be acquired at each pixel of a LSM scan in real-time. The resulting waveforms and LSM image may be stored separately or jointly (e.g., in storage 124). If stored separately as different files or as different entries in a common (or different) database, synchronization data (e.g., time) may also be stored so that each digitized DUT signal 128 may be tied or related to individual pixels in the corresponding LSM image. As used herein, the term "waveform map" refers to the capture of a 2-dimensional LSM image and the corresponding digitized DUT signals when each LSM pixel's corresponding DUT signal is captured in response to one or more complete test-loops. Each pixel of a waveform map generated in accordance with this disclosure can be expanded to reveal the waveform acquired at that location. Moreover, because waveforms contain detailed information about the active DUT, once a waveform map is created, offline data processing enables a large number of secondary data maps to be created. These data maps can quickly highlight specific features of the waveform that are of interest. In particular, waveform maps lend themselves to autocorrelation or template matching. By way of example, a sliding window cross-correlation algorithm can be applied to a waveform map in accordance with this disclosure to generate an array of correlation coefficients. The resulting correlation coefficient curve may be used to quantify the similarity between the examined waveforms and that of a template waveform. Furthermore, offline processing of the waveform map enables more computational analysis like fractional dimensional algorithms, which can be used to determine transient effects between two waveforms.

Figure 2:
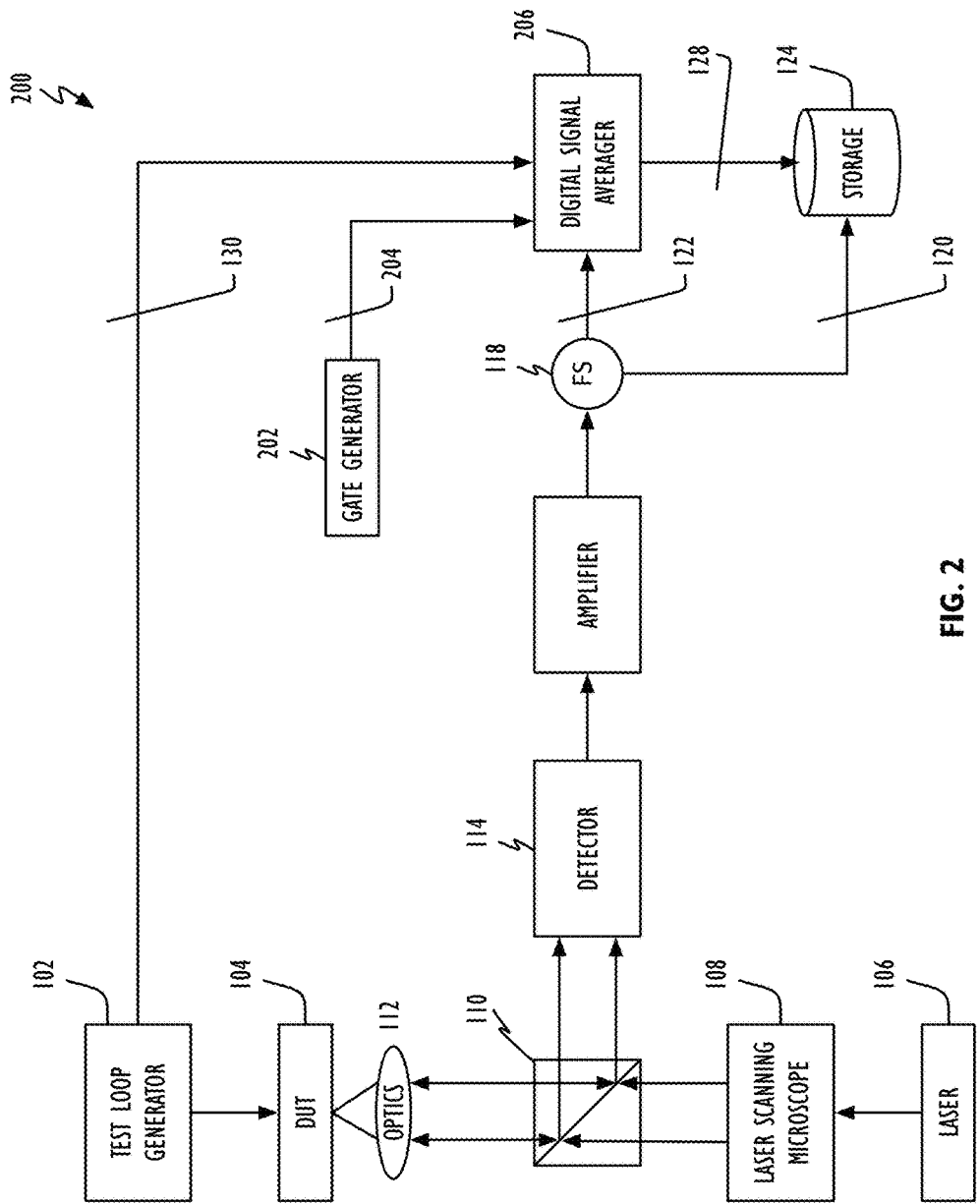
FIG. 2 shows, in block diagram form, a diagnostic system in accordance with another one or more embodiments.
Figure 3:
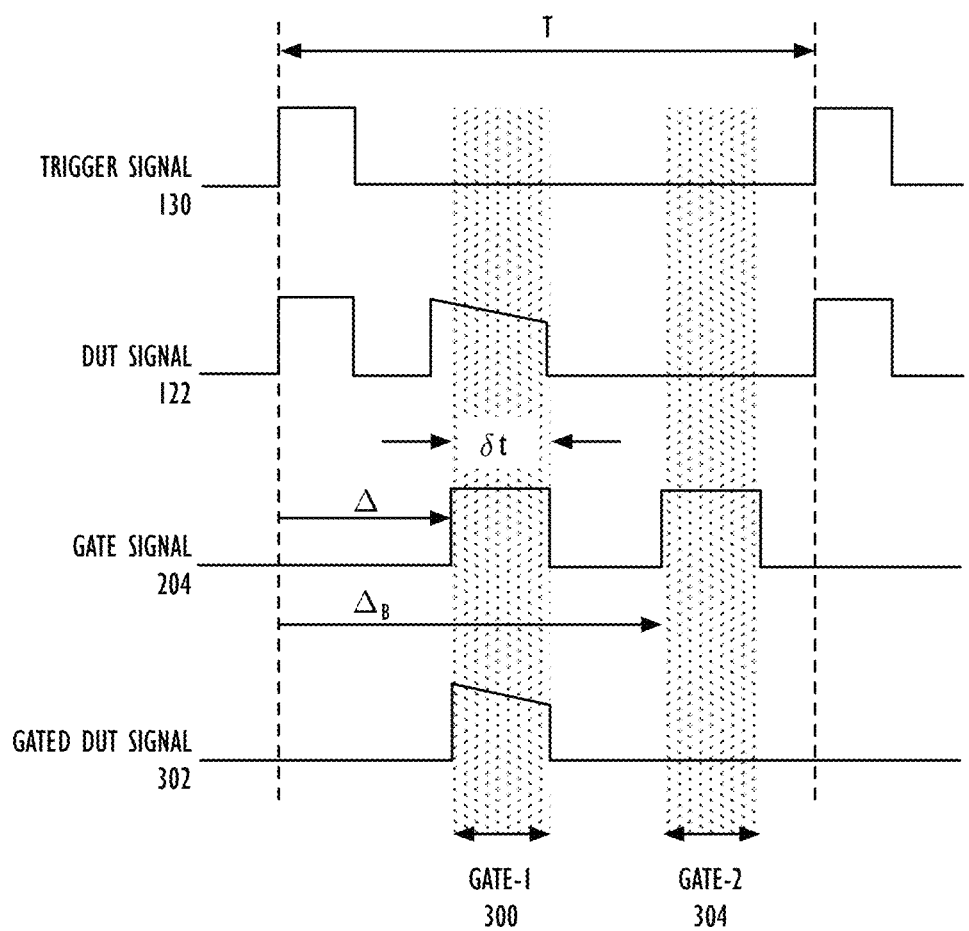
FIG. 3 shows various illustrative signals used during diagnostic operations in accordance with one or more embodiments.

In another one or more embodiments, digital signal averager 126 may be configured such that it digitizes DUT signal 122 only during a portion of the applied test-loop. Referring to FIG. 2, diagnostic system 100 modified in accordance with this approach (identified as diagnostic system 200) uses gate generator 202 to generate gate signal 204 to control the time during which digital signal averager 206 generates digital waveform output 128. Referring now to FIG. 3 (in light of FIG. 2), digital signal averager 206 (e.g., a high-speed integrator) receives DUT signal 122 and synchronous clock or trigger signal 130. Trigger signal 130 defines the test-loop period (T) and the corresponding repetition rate (1/T). Gate signal 204 (specifically during gate-1 300) is defined by a gate-delay, Δ, which determines the start of the acquisition window relative to the assertion of trigger signal 130, and a gate-width, δt. As used here, a "gate" defines a window of time in which to integrate the DUT response signal 122. In the current embodiment, digital integrator 206 only recognizes that portion of DUT signal 122 encompassed by gate-1 300; only this signal, $V_g(t)$ 302, is presented to integrator 206. Gated DUT signal $V_g(t)$ 302 may therefore be given by:

$$V_g(t)302 = V(t)122 \text{ when } \Delta \le t \le \Delta + \delta t. \qquad \text{EQ. 1}$$

Because integrator 206 averages this signal over n test-loops, integrator output $V_O$ 128 may be written as:

$$V_O 128 = nK\int_0^T V_g(t)dt = nK\int_\Delta^{\Delta+\delta t} V_g(t)dt, \qquad \text{EQ. 2}$$

where K is a constant defined by the hardware (e.g., integrator 206). Based on FIG. 3, the acquisition time of output signal $V_O$ 128 is proportional to nT.

In practice a second gate, gate-2 304, may be used to acquire a baseline DC measurement. Generally, the gate width of gate-2 304 matches the width defined by gate-1 300, δt. In some embodiments, gates within a gate set may have different widths. For example, a gate for capturing the "fault" signal may be as short as needed to capture the necessary signal (see discussion below) and the gate to capture the background may be as long as possible. In this way the signal-to-noise ratio of the "background" value may be improved (compared to having a short background window width to match the width of the pair's other gate). When different width gates are used, they should be normalized before combining. Gate-2 304 may typically span a section of DUT signal 122 that is void of signal. The output voltage $V_O$ 128 in this case may then be the difference between the DUT signal acquired during gate-1300 and the DUT signal acquired during gate-2 304. This may be expressed as:

$$V_O 128 = nK(\int_\Delta^{\Delta+\delta t} V(t)dt - \int_{\Delta_B}^{\Delta_B+\delta t} V(t)dt). \qquad \text{EQ. 3}$$

Defining gates requires collecting a single, representative waveform using conventional LVP techniques or using a simulated waveform. The choice of gates depends on the test pattern (e.g., as generated by test-loop generator 102) and the desired information. In general, the gate-width should be as large as possible without compromising the desired DUT signal information. This can maximize the resulting captured signal and the corresponding signal-to-noise ratio. Once the gates are established, the techniques described herein can map the DUT's response signal (e.g., signal 122) without further LVP waveform collection. This detection scheme allows any unique feature within the DUT response signal (resulting from the applied test pattern) to be gated, measured, and mapped onto a LSM image without relying on the spectral components of the signal. As used herein, the term "gated-LVI" refers to the capture of a 2-dimensional LSM image and the corresponding digitized DUT signals when each LSM pixel's corresponding DUT signal is a response to the application of less than one or more complete test-loops. One or more gates (or gate sets) may be used to select that portion of the DUT response captured. As used herein, the term "laser voltage tracing" or "LVT" refers to either waveform mapping (see above) or gated-LVI operations.

Figure 4:
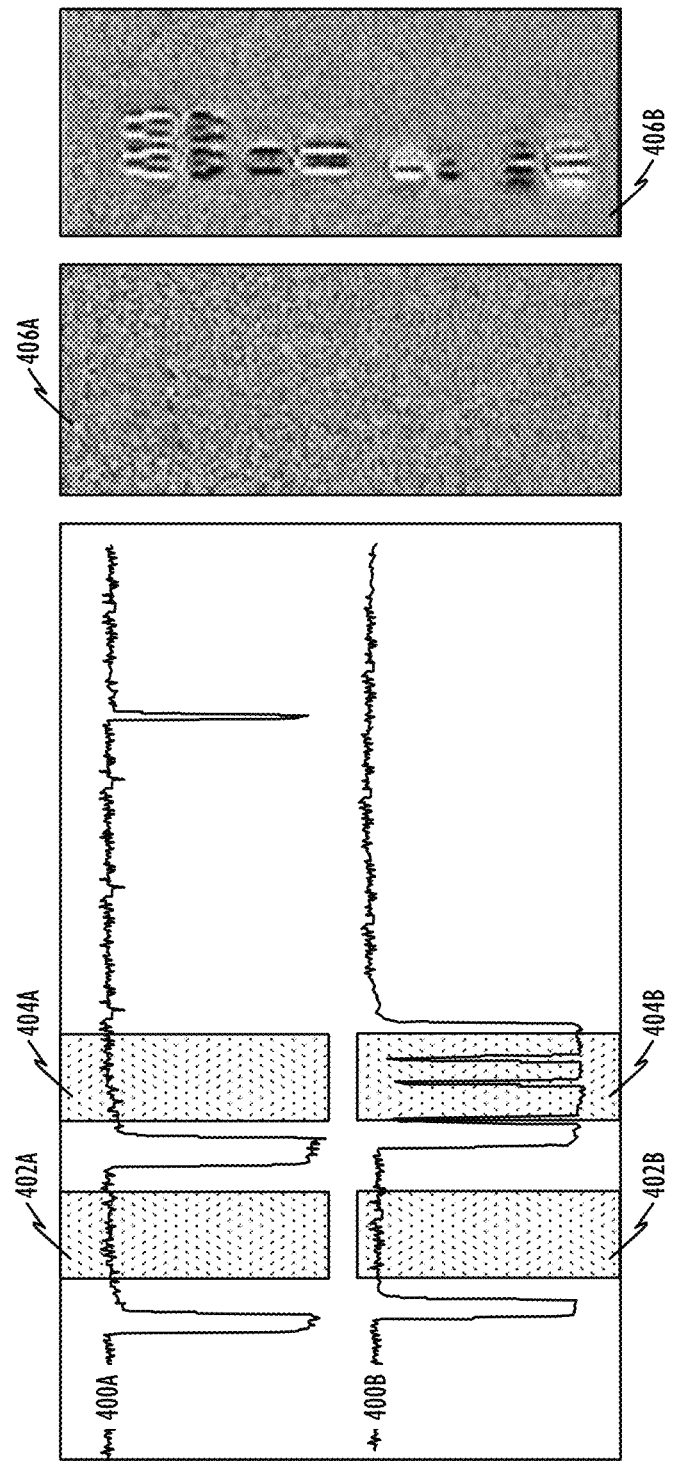
FIG. 4 is representative of data collected from a device under test in accordance with one embodiment.

FIG. 4 is representative of data collected using a boxcar averager as component 206 and a 180 nanometer (nm) inverter chain for DUT 104. The test-loop spanned 20 microseconds (μs); only a 4 μs span is shown. DUT response signal 400A represents a good (passing) signal while waveform 400B represents a bad (failing) waveform. Regions 402A, 404A represent a gate set used to generate map 406A, and regions 402B and 404B represent a gate set used to generate map 406B. In this example, the objective is to capture/map the DUT's failure signals. Gates 402A and 402B are used to acquire baseline data. Gate 404B includes or encompasses an event that is present only when the DUT is failing and includes pulses which are sub-100 nanosecond (ns) in duration amounting to less than 0.5% of the total test-loop length; making the desired signals far too short for prior art LVI techniques to work. Defined in this manner, gate sets 402A/404A and 402B/404B produce an LVT signal only under failing conditions. Images 406A and 406B were collected with a 350×2.45NA solid immersion lens (SIL) and a 1320 nm continuous wave laser. Gates 402A/404A and 402B/404B and scan speed were constant for both images. As expected, passing condition 400A generates map 406A that is void of signal. Using a test-loop that generates failing DUT response 400B yields LVT map or image 406B that clearly highlights where the failing signal is present. Because LVT displays signals relative to a baseline (see EQ. 3), LVT has the added benefit of elucidating the relative polarity of the gated signal at a particular pixel. The black regions (signal) in map 406B corresponds to a negative response from signal integrator 206. This is the case when the gated event is below the baseline signal (compare signal 400B between gates 402B and 404B). The white regions (signal) in map 406B on the other hand correspond to a positive response from signal integrator 206, which occurs when the failing signal becomes inverted (see FIG. 5). Signal inversion occurs for a variety of reasons. For example, NMOS and PMOS transistors exhibit opposite polarity, as do transistor gates and drains in some instances.

Figure 5:
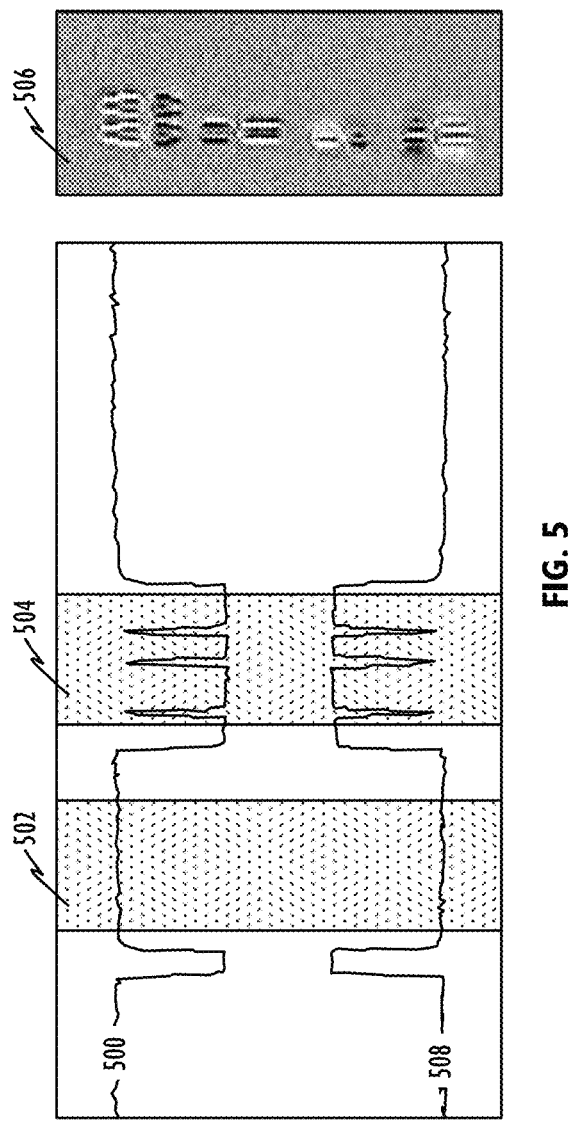
FIG. 5 is representative of data collected from another device under test in accordance with another embodiment.

Referring to FIG. 5, DUT signal 500 produces a negative LVT signal (represented by black regions in map 506) because signal 500 within gate 504 sits below the baseline signal level in gate 502. DUT signal 508 is identical to signal 500, except that it is inverted. In this case, the LVT signal is positive (represented by white regions in map 506) because that portion of signal 508 within gate 504 sits above the baseline signal within gate 502.

LVT optimization requires an understanding of several interrelated averager/integrator parameters (e.g., component 206). Generally, the test engineer or user controls the test-pattern frequency—defined by FIG. 3 as the repetition rate (1/T)—and the amount of averaging, n. The measurement bandwidth, BW, depends on these two parameters:

$$BW = C/nT, \qquad \text{EQ. 4}$$

where 'C' is a constant that depends upon the specific type of hardware averager used. In one embodiment, for example, C=0.442. Bandwidth determines the LVT acquisition time by limiting the laser scanning microscope's pixel dwell time:

$$\text{Dwell Time} \sim 1/3 BW. \qquad \text{EQ. 5}$$

For testing purposes LVT images/maps were collected on a Meridian V (manufactured by FEI Company) equipped with a 2.9NA SIL, 1064 nm continuous wave laser, and a low-frequency detector for component 114. (The 1064 nm laser has improved resolution over the 1320 nm laser identified above. It has been determined that photocurrent injection caused by the shorter wavelength photons has a negligible effect on the signal.) The DUT was a 28 nm device stimulated with a variety of pulsed signals. The pulse amplitude, test-loop period, gate/pulse width and number of test-loops averaged were adjusted independently. The resulting LVT images were processed and analyzed.

Figure 6:
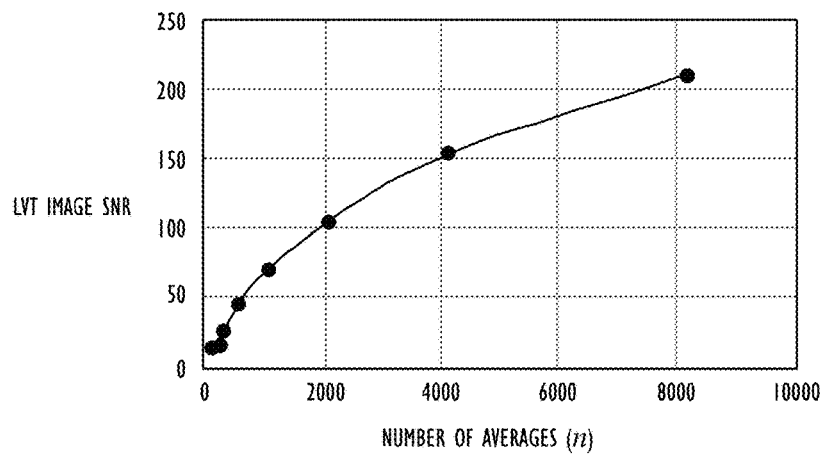
FIG. 6 shows the relationship between LVT signal-to-noise and the number of test-loops over which an output signal is averaged in accordance with one embodiment.

Referring to FIG. 6, the relationship between the LVT signal-to-noise ratio (SNR) and the number of averages (n) is shown. To obtain this data, a 20 ns square pulse and matching 20 ns wide gate signals were used. The bandwidth was held constant at 270 Hz by decreasing the test-loop period (T) as the averages were increased (see EQ. 4). Each 512×512 pixel LVT image required approximately 8 minutes to collect; an average of less than 2 ms-per-pixel or 2 ms-per-waveform. In contrast, a functionally equivalent image captured using conventional LVI techniques (at 10 seconds-per-pixel, a very liberal estimate) would take approximately:

$$(512^2 \text{ pixels}) \frac{10 \text{ seconds}}{\text{pixel}} \sim 43{,}690 \text{ seconds} \sim 728 \text{ hours} \sim 30 \text{ days}.$$

Figure 7:
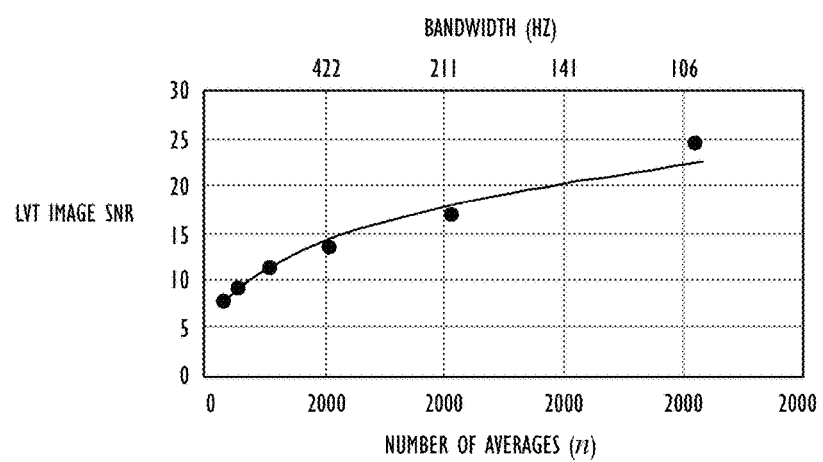
FIG. 7 shows the relationship between LVT signal-to-noise, the number of test-loops over which an output signal is averaged and the measurement bandwidth required to effect the target measurements in accordance with another embodiment.

In practice it has been found that the test-loop period is often difficult or impossible to adjust. With a constant test-loop length, increasing the number of test-loops averaged decreases the bandwidth. Taking this into consideration, the data represented in FIG. 7 is based on a constant loop-length of 1 μs and a pulse-width of 10 ns. As shown, the data here deviates slightly from that presented in FIG. 6. Although the general trend still holds, i.e. increasing n increases SNR, the effect is muted. The bandwidth change causes this outcome. Over the observed range, the LVT signal amplitude exhibited a modest increase with increasing bandwidth. Therefore, as n increases the decreasing bandwidth negatively affects the signal strength, which hinders the SNR gain. Other data indicates that test-loop period variation had a negligible effect on image SNR. Alternatively, increasing either the DUT signal strength or the gate width improves SNR. For most of the images discussed herein, the waveform (LVP) amplitude, which serves as a measure of the DUT signal strength, was roughly 300 microvolts (μV). Pulse-widths, relative to test-loop period, ranged from several percent to 0.1%. Under these conditions, 1024 averages provided sensitivity that rivaled traditional LVI. In some cases, as few as 256 averages provided sufficient SNR.

When optimizing the LVT image, the interplay between SNR and acquisition time should not be ignored. Although DUT signal amplitude and test-loop pulse width affect SNR, these parameters are often fixed or difficult to alter. Averaging, therefore, plays an important role in SNR optimization. Increasing the number of test-loops over which an average is obtained improves SNR but negatively impacts the acquisition time. Specifically, combining EQS. 4 and 5 gives:

$$\text{Dwell Time} \sim 0.754nT. \quad \text{EQ. 6}$$

As such, the test-loop period, T, should be minimized to accelerate data acquisition. Otherwise, acquisition times scale with averaging.

LVT is a powerful technique that can be used when test patterns prohibit LVI analysis. If a failing circuit produces an abnormal signal, that signal can be gated. Defining the gates requires collecting only one waveform or using a simulated waveform. Finding the root cause of a circuit's failure without LVT involves tracing the failing signal through the circuit with LVP, which may require hundreds of waveforms and days of labor. LVT as disclosed herein renders much of this probing unnecessary by providing a visual map of the failing signal. Probing ensues only once the suspect component is identified and further localization is required.

Laser voltage tracing (LVT) introduces a new approach to monitoring a DUT's response to an applied test-loop. As used here, LVT refers to both waveform mapping and gated-LVI operations. In the former, a DUT's response to one or more complete test-loops is recorded while in the latter the DUT's response to only a portion of a test-loop is recorded (that portion being defined by gates). Both approaches permit the real-time acquisition of DUT signals at each pixel of a corresponding LSM image. In particular, the disclosed LVT techniques enable imaging DUT signals that are difficult or impossible to detect using prior art LVI techniques. When the signal from an active DUT is not periodic or significantly deviates from 50% duty-cycle, a conventional LVI signal monitoring scheme (spectrum analyzer, lock-in amplifier, vector analyzer, etc.) becomes ineffective. Because these devices depend on the signal containing a strong frequency component that can be monitored, decreasing duty-cycle or periodicity of the monitored signal significantly and adversely affects the strength of these frequency components. Using LVT, measurements can be made independent of the DUT signal's duty-cycle or periodicity. By way of example only, LVT may be applied to debugging problematic peripheral NAND circuitry. Test and debug operations on this type of circuitry typically involve pulsed signals that prevent the use of other imaging techniques, such as LVI. As a result, LVT decreases superfluous probing and assists in probe placement when warranted.

Figure 8:
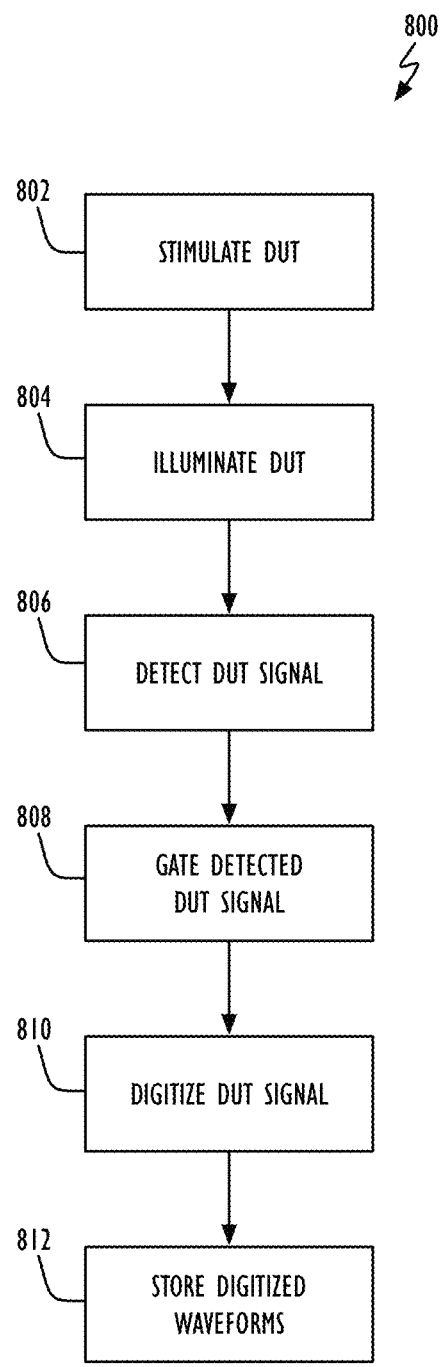
FIG. 8 shows, in flowchart form, a circuit diagnostic operation in accordance with one embodiment.

Referring to FIG. 8, circuit diagnostic operation 800 in accordance with one embodiment is shown that captures the salient operating features of the systems disclosed above. Operation 800 begins by electrically stimulating a DUT (block 802). This may be accomplished by a test-loop generator such as component 102. The DUT may then be illuminated with a laser beam in a raster scan method (block 804). This may be accomplished, for example, with laser 106, LSM 108, element 110 and optics 112. It should be noted that not all of a DUT need be illuminated. Laser light reflected from the DUT may then be detected (block 806). As discussed above, the reflected light may have DC and AC components. The DC component represents the (grayscale) LSM image and the AC component the DUT's response to the applied test pattern of electrical stimulation. Next, the AC component may be gated (808) while being averaged and prior to being digitized (block 810). In one embodiment, a gate signal may be applied so that the DUT's response to multiple complete test patterns may be averaged. In this case, operation 800 may be referred to as waveform mapping. In another embodiment, a gate signal may be applied so that the DUT's response to multiple partial test patterns may be averaged. In this case, operation 800 may be referred to as gated-LVI mapping. Finally, the digitized DUT responses and corresponding LSM image may be stored (block 812)

Figure 9:
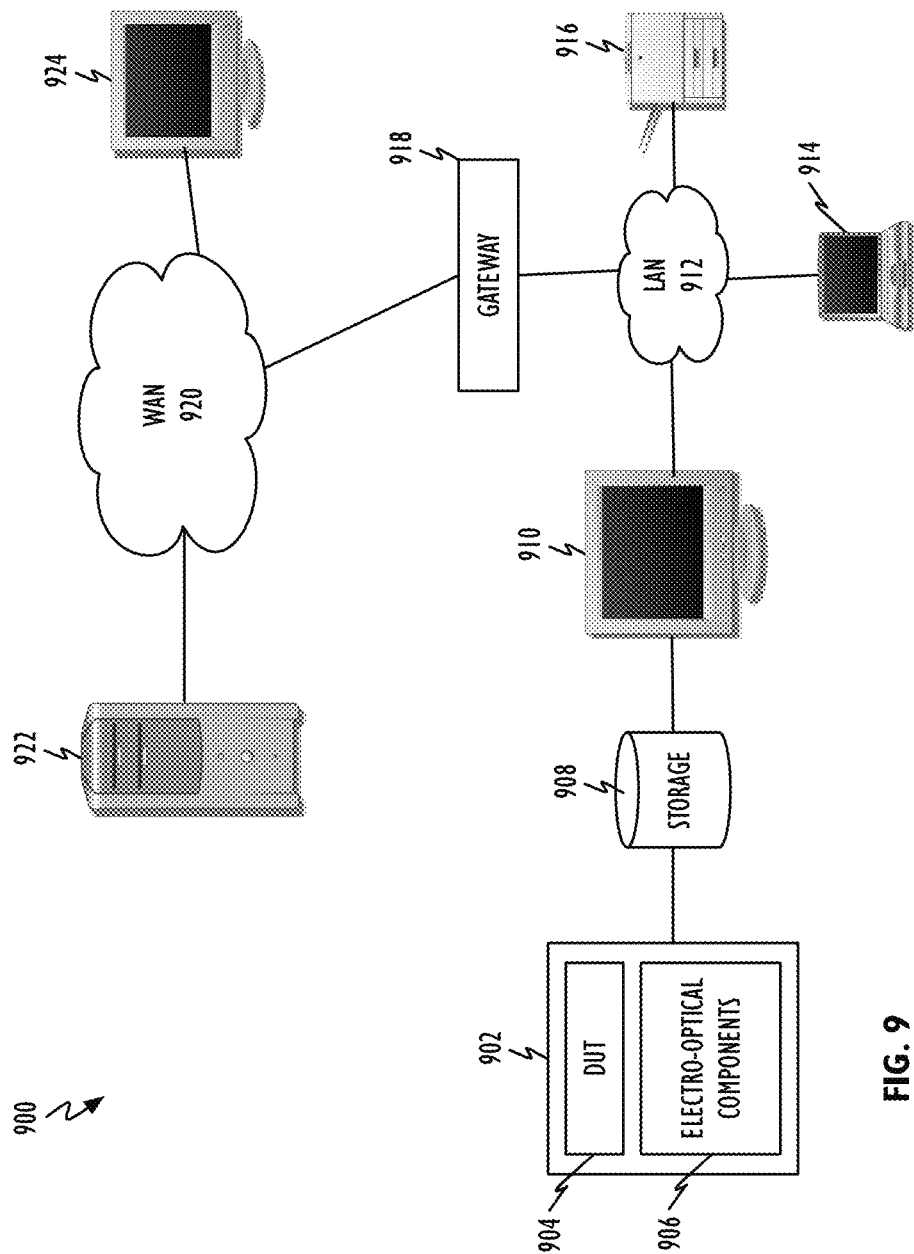
FIG. 9 shows, in block diagram form, a network in accordance with one or more embodiments.

Referring to FIG. 9, network 900 may include diagnostic system 902 (including DUT 904 and electro-optical components 906), storage 908 and local processing system 910. By way of example, diagnostic system 902 may be similar to either of systems 100 and 200. Waveforms captured in accordance with this disclosure by diagnostic system 902 may be stored on storage 908. As previously noted, both LSM image data and waveform data may be stored on storage 908. These data may be stored separately (e.g., as different files or as entries in a common or different database) or as a single entity or file. Processing system 910 may, for example, be an engineering workstation or a personal computer. Processing system 910 may be communicatively coupled to local area network (LAN) 912 and, through it, to other local devices such as computer system 914 and printer 916. Processing system 910 may also use LAN 912 and gateway and/or router 918 to communicate to yet other devices coupled to wide area network (WAN) 920 (e.g., server storage 922 and computer system 924). Networks 912 and 918 may use any desired technology (wired, wireless or a combination thereof) and communication protocol (e.g., TCP, or transmission control protocol and PPP, or point to point). Processing system 910 may execute one or more programs or applications that permit it to access and process waveform data of the type described here. Such programs or applications may be stored in non-transitory storage at processing system 910, in a non-transitory portion of storage 908 or on non-transitory network storage such as server storage system 918.

It is to be understood that the above description is intended to be illustrative, and not restrictive. The material has been presented to enable any person skilled in the art to make and use the disclosed subject matter as claimed and is provided in the context of particular embodiments, variations of which will be readily apparent to those skilled in the art (e.g., some of the disclosed embodiments may be used in combination with each other). The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A system for testing a circuit, comprising:
   a test-loop generator configured to supply a test-loop signal to the circuit, wherein the test-loop signal comprises a stimulus signal that repeats every test-loop period;
   a laser source;
   first optics configured to direct a continuous wave laser beam from the laser source onto the circuit;
   a sensor configured to detect reflected laser light from the circuit and to generate a sensor output in response thereto; and
   a high-speed digital signal averager configured to generate a digital output signal based on the sensor output and a synchronization signal, wherein the high-speed digital signal averager generates a digital output signal for each location of a raster scan of the continuous wave laser beam.

2. The system of claim 1, wherein the first optics comprises a laser scanning microscope (LSM) configured to raster scan the continuous wave laser beam across an area of the circuit to produce the raster scan.

3. The system of claim 2, wherein the sensor output comprises a direct-current (DC) component and an alternating-current (AC) component.

4. The system of claim 3, wherein the AC component corresponds to a response signal of the circuit to the test-loop signal.

5. The system of claim 3, wherein the DC component corresponds to a LSM image.

6. The system of claim 5, wherein the synchronization signal comprises a pixel clock from the LSM.

7. The system of claim 1, further comprising memory configured to store the digital output signals for each of the locations.

8. The system of claim 1, wherein the digital output signal is based, at each location, on an AC component of the sensor output resulting from the stimulus signal over multiple complete test-loop periods.

9. The system of claim 8 further comprising memory configured to store the digital output signals for each of the locations.

10. The system of claim 1, wherein the high-speed digital signal averager is configured to receive a gate signal, wherein the gate signal defines at least one gate period that is less than the test-loop period.

11. The system of claim 10, wherein the digital output signal is based, at each location, on an AC component of the sensor output resulting from the stimulus signal during the gate period over multiple test-loop periods.

12. The system of claim 11 further comprising memory configured to store the digital output signal.

13. The system of claim 1, wherein the high-speed digital signal averager comprises a high-speed integrator circuit.

14. The system of claim 1, wherein the synchronization signal comprises a signal from the test-loop generator.

15. The system of claim 1, wherein the high speed digital signal averager generates a waveform map, and wherein each pixel of the waveform map can be expanded to reveal a waveform acquired at that location.

16. The system of claim 1, further comprising second optics configured to collect reflected laser light from the circuit.

17. A system for testing a circuit, comprising:
  a test-loop generator configured to supply a test-loop signal to the circuit, wherein the test-loop signal comprises a stimulus signal that repeats every test-loop period;
  a laser source;
  first optics configured to direct a laser beam from the laser source onto the circuit;
  a sensor configured to detect reflected laser light from the circuit and to generate a sensor output in response thereto;
  a high-speed digital signal averager configured to generate a digital output signal based on the sensor output and a synchronization signal; and
  a gate-generator circuit electrically coupled to the high-speed signal averager and configured to output a gate signal having a gate start time and a gate duration, wherein the duration is less than the test-loop period.

18. The system of claim 17, wherein the digital output signal is further based on the gate signal.

19. The system of claim 18, wherein the digital output signal represents the AC component during the duration over a plurality of test-loop periods.

20. A diagnostic measurement method, comprising:
  stimulating a device under test with a test pattern, the test pattern comprising a stimulus signal that repeats every test-loop period;
  illuminating an area of the device under test with a laser beam in a raster scan;
  detecting light reflecting off the device under test in response to the illuminating;
  identifying a direct-current (DC) component and an alternating-current (AC) component of the detected reflected light;
  averaging the AC component over a plurality test-loop periods based on a trigger signal and a gate signal, wherein the trigger signal synchronizes the AC component to the test pattern and during each test-loop period the gate signal selects a portion of the AC component corresponding to a time that is less than the test-loop period to be averaged;
  digitizing the averaged AC component to generate an output signal; and
  storing the output signal in a memory.

21. The method of claim 20, wherein averaging and digitizing are performed by a high-speed integrator device.

22. The method of claim 20, wherein the output signal is a waveform map and wherein each pixel of the waveform map can be expanded to reveal a waveform acquired at that location.

23. The method of claim 20, wherein the step of illuminating an area of the device under test with a laser beam in a raster scan comprises performing a single sweep of the laser beam.

* * * * *